(12) United States Patent
Chan et al.

(10) Patent No.: US 11,824,122 B2
(45) Date of Patent: Nov. 21, 2023

(54) METHOD FOR FILLING A SPACE IN A SEMICONDUCTOR

(71) Applicant: IMEC VZW, Leuven (BE)

(72) Inventors: Boon Teik Chan, Wilsele (BE); Waikin Li, Leuven (BE); Zheng Tao, Heverlee (BE)

(73) Assignee: Imec vzw, Leuven (BE)

( * ) Notice: Subject to any disclaimer, the term of this patent is extended or adjusted under 35 U.S.C. 154(b) by 118 days.

(21) Appl. No.: 17/208,800

(22) Filed: Mar. 22, 2021

(65) Prior Publication Data
US 2021/0296500 A1 Sep. 23, 2021

(30) Foreign Application Priority Data
Mar. 23, 2020 (EP) ..................... 20164988

(51) Int. Cl.
*H01L 29/78* (2006.01)
*H01L 29/06* (2006.01)
*H01L 29/66* (2006.01)

(52) U.S. Cl.
CPC ...... *H01L 29/7853* (2013.01); *H01L 29/0669* (2013.01); *H01L 29/66545* (2013.01); *H01L 29/66818* (2013.01)

(58) Field of Classification Search
CPC ............ H01L 29/7853; H01L 29/0669; H01L 29/66545; H01L 29/66818
See application file for complete search history.

(56) References Cited

U.S. PATENT DOCUMENTS

| | | | |
|---|---|---|---|
| 7,923,329 B2 | 4/2011 | Ban | |
| 9,093,558 B2 | 7/2015 | Edge et al. | |
| 9,159,630 B1 | 10/2015 | Wei et al. | |
| 10,074,575 B1 | 9/2018 | Guillorn et al. | |
| 2014/0273373 A1* | 9/2014 | Makala | H01L 29/66825 438/270 |

(Continued)

OTHER PUBLICATIONS

Bailey, T.C., et al., "Reflectivity-Induced Variation in Implant Layer Lithography", Proceedings of SPIE—The International Society for Optical Engineering, Mar. 2008, vol. 6924, pp. 69244F-1 to 69244F-11.

(Continued)

*Primary Examiner* — Christine A Enad
(74) *Attorney, Agent, or Firm* — McDonnell Boehnen Hulbert & Berghoff LLP

(57) ABSTRACT

A method for partially filling a space between two superimposed structures in a semiconductor device under construction is provided. The method includes the steps of: (a) providing the two superimposed structures having said space therebetween; (b) entirely filling said space with a thermoplastic material; (c) removing a first portion of the thermoplastic material present in the space, the first portion comprising at least part of a top surface of the thermoplastic material, thereby leaving in said space a remaining thermoplastic material having a height; and (d) heating up the remaining photosensitive thermoplastic material so as to reduce its height. A replacement metal gate process for forming a different gate stack on two superimposed transistor channels in a semiconductor device under construction as well as a semiconductor device under construction is also provided.

15 Claims, 4 Drawing Sheets

(56) References Cited

U.S. PATENT DOCUMENTS

| | | |
|---|---|---|
| 2017/0108776 A1 | 4/2017 | Cameron et al. |
| 2019/0172828 A1* | 6/2019 | Smith ............. H01L 21/823842 |
| 2019/0371655 A1 | 12/2019 | Hsiao et al. |
| 2019/0393304 A1* | 12/2019 | Guillorn ............... H01L 21/308 |
| 2021/0134950 A1* | 5/2021 | Hsu ................ H01L 21/823462 |
| 2021/0210349 A1* | 7/2021 | Xie ................... H01L 21/76224 |

OTHER PUBLICATIONS

Dong, L., et al., "Mitigating the Influence of Wafer Topography on the Implantation Process in Optical Lithography", Optics Letters, Aug. 1, 2017, vol. 42(15), pp. 2934-2937.

Lee, H-R, et al., "Message to the Undecided: Using DUV dBARC for 32-nm Node Implants", Proc. SPIE 7273, Advances in Resist Materials and Processing Technology XXVI, Apr. 1, 2009, vol. 7273, pp. 72730Y-1 to 72730Y-12.

Ryckaert, J., et al., "The Complementary FET (CFET) for CMOS Scaling Beyond N3", 2018 Symposium on VLSI Technology Digest of Technical Papers, pp. 141-142.

Extended European Search Report from the European Patent Office, dated Dec. 15, 2020 for European Patent Application No. 20164988. 6, pp. 1-5.

\* cited by examiner

METHOD FOR FILLING A SPACE IN A SEMICONDUCTOR

CROSS-REFERENCE

This application claims priority from European patent application serial no. 20164988.6, filed Mar. 23, 2020, which is incorporated by reference in its entirety.

TECHNICAL FIELD OF THE DISCLOSURE

The present disclosure relates to the field of semiconductor processing and more in particular to the partial filling of space between features in such processing.

BACKGROUND OF THE DISCLOSURE

In the field of semiconductor processing, there is a constant demand for methods enabling smaller and smaller features of controlled dimensions and smaller and smaller gaps of controlled dimensions between these features. When a gap between two features needs to be only partially filled, for instance to isolate both features, a filling which can provide a flat interface at a well-controlled position between the two features is highly desirable. This is, for instance, the case when a gap between two superimposed features needs to be partially filled. One way to partially fill that gap is by first entirely fill it with a material, followed by an etch back of the material until only part of the gap is filled. However, the etch back process is typically problematic. Indeed, part of the filling material is hardly accessible from above because of a shadow effect due to the top feature. This typically results in the filling material forming a spike projecting from the filling material toward the bottom surface of the top feature. Removing this spike or limiting its height is typically achieved by continuing the etch back process until the height of this spike has been sufficiently reduced. This has the disadvantage of imposing a lower limit to the gap height that can be partially filled between two given superimposed features.

This situation can occur for instance when two superimposed transistor channels need to be isolated from one another.

Ryckaert J. et al. (*Symp. VLSI Technol. Dig. Tech. Papers*, pp. 141-142, 2018) discloses a process for the formation of a Complementary Field Effect Transistor (CFET) where a stack of two channel types, an n-type channel atop a p-type channel, is formed. At the end of that process, a replacement metal gate step is performed where the dummy gate is replaced by the actual gate stack. Since the gate stack must be different for the bottom p-type channel and the top n-type channel, a step where the bottom p-type channel and at least part of its gate stack are protected during the formation of the different top gate stack will typically occur. This protection typically includes a step where the space between the p-type channel and at least part of its gate stack and the n-type channel and at least part of its gate stack is partially filled. How this can be achieved is not explicit in that article.

Thus, there is still a need in the art for methods overcoming at least partially one or more of the issues mentioned above.

SUMMARY OF THE DISCLOSURE

It is an object of the present disclosure to provide good methods for partially filling a space between two superimposed structures in a semiconductor device.

The above objective is accomplished by a method and device according to the present disclosure.

In a first aspect, the present disclosure relates to a method for partially filling a space between two superimposed structures in a semiconductor device under construction, the method comprising the steps of:
 a. Providing the two superimposed structures having said space therebetween,
 b. Entirely filling the space with a thermoplastic material,
 c. Removing a first portion of the thermoplastic material present in the space, the first portion comprising at least part of a top surface of the thermoplastic material present in the space, thereby leaving in the space a remaining thermoplastic material having a height, and
 d. heating up the remaining thermoplastic material so as to reduce its height.

In embodiments of the present disclosure, a small space (e.g. 30 nm or less) present between two superimposed structures can be partially filled. In particular, a smaller space (e.g. up to 10 nm smaller) can be partially filled than if a combination of the use of a hardmask material for completely filling the space, followed by dry etching of the material from the top, was used. In other words, the present disclosure permits the increase of the process window.

In embodiments of the present disclosure, the material partially filling the space may have a flat top surface.

In a particular embodiment of the first aspect, the method relates to a replacement metal gate process for forming a different gate stack on two superimposed transistor channels in a semiconductor device under construction, the process comprising:
 (i) Performing the method according to any embodiment of the first aspect wherein each of the two superimposed structures comprises:
   a. a transistor channel having a dielectric layer thereon, and
   b. a first conductive layer on the dielectric layer, thereby protecting the first conductive layer of the lowest of both superimposed structures,
 (ii) removing the first conductive layer from the highest of both superimposed structures, thereby exposing the dielectric layer of the highest of both superimposed structures,
 (iii) removing the heated remaining thermoplastic material, thereby exposing the first conductive layer of the lowest of both superimposed structures, and
 (iv) coating with a second conductive layer:
   a. the dielectric layer of the highest of both superimposed structures, and
   b. the first conductive layer of the lowest of both superimposed structures,
 thereby forming a different gate stack on the two superimposed transistor channels.

In a second aspect, the present disclosure relates to a semiconductor device under construction comprising
 a. two superimposed structures having a space therebetween, and
 b. a photosensitive thermoplastic material partially filling said space, said material being such as to become selectively removable after exposure to an electromagnetic radiation with respect to the same photosensitive thermoplastic material not having been exposed to the electromagnetic radiation.

Particular aspects of the disclosure are set out in the accompanying independent and dependent claims. Features from the dependent claims may be combined with features of the independent claims and with features of other dependent claims as appropriate and not merely as explicitly set out in the claims.

Although there has been constant improvement, change and evolution of devices in this field, the present concepts are believed to represent substantial new and novel improvements, including departures from prior practices, resulting in the provision of more efficient, stable and reliable devices of this nature.

The above and other characteristics, features and advantages of the present disclosure will become apparent from the following detailed description, taken in conjunction with the accompanying drawings, which illustrate, by way of example, the principles of the disclosure. This description is given for the sake of example only, without limiting the scope of the disclosure. The reference figures quoted below refer to the attached drawings.

BRIEF DESCRIPTION OF THE DRAWINGS

FIG. 3 shows a space (15) between two superimposed structures (16, 17) (a fin (1) and a vertical nanosheet (1) are depicted on the left side and a vertical nanosheet (1) on a vertical nanosheet (1) are depicted on the right side) is visible, partially filling this space (15) (see FIG. 7) corresponds to providing thermoplastic material (14) on the top surface of the bottom structure (16) but not providing enough material (14) to reach the bottom surface of the top structure (17).

FIG. 4 shows entirely filling said space (15) with a photosensitive thermoplastic material (14) which becomes selectively removable after exposure to an electromagnetic radiation (19) with respect to the same photosensitive thermoplastic material (14) not having been exposed to the electromagnetic radiation (19).

FIG. 5 shows exposing a first portion (18) of the photosensitive thermoplastic material (14) present in said space (15) to the electromagnetic radiation (19) for making this first portion (18) removable.

FIG. 6 shows the profile of the remaining thermoplastic material (14) may comprise a narrower section at a top portion of the space (15) and a broader section at a bottom portion of the space (15) with the height (h) of the photosensitive thermoplastic material (14) corresponding to the vertical extent of the space (15).

FIG. 7 shows the result of step d after the exposure step and the selective removal step to further reduce the height of the photosensitive thermoplastic material.

Figure 1:
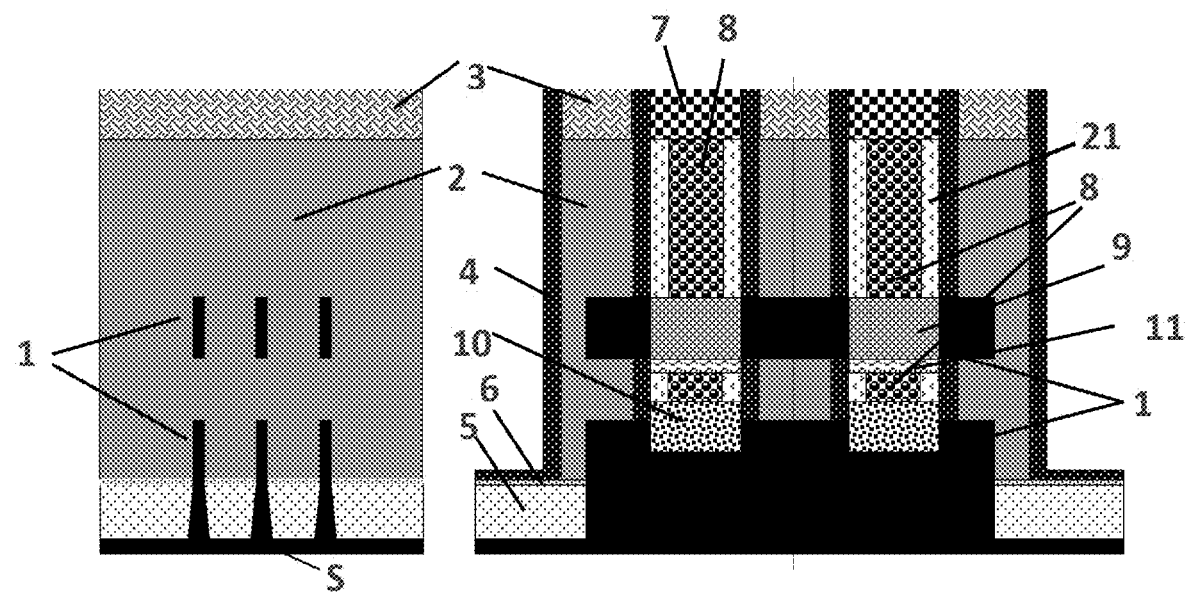
FIG. 1 is a vertical cross-section through a semiconductor device under construction just before a replacement metal gate process according to an embodiment of the present disclosure; on the left, the cross-section is taken perpendicular to the longitudinal direction of the device fins while on the right the cross-section is taken along a device fin.

In the different figures, the same reference signs refer to the same or analogous elements.

DESCRIPTION OF ILLUSTRATIVE EMBODIMENTS

The present disclosure will be described with respect to particular embodiments and with reference to certain drawings but the disclosure is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the disclosure.

Furthermore, the terms first, second, third and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the disclosure described herein are capable of operation in other sequences than described or illustrated herein.

Moreover, the terms top, bottom, over, under and the like in the description and the claims are used for descriptive purposes and not necessarily for describing relative positions. It is to be understood that the terms so used are interchangeable under appropriate circumstances and that the embodiments of the disclosure described herein are capable of operation in other orientations than described or illustrated herein.

The term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. The term "comprising" therefore covers the situation where only the stated features are present and the situation where these features and one or more other features are present. The word "comprising" according to the disclosure therefore also includes as one embodiment that no further components are present. Thus, the scope of the expression "a device comprising means A and B" should not be interpreted as being limited to devices consisting only of components A and B. It means that with respect to the present disclosure, the only relevant components of the device are A and B.

Reference throughout this specification to "one embodiment" or "an embodiment" means that a particular feature, structure or characteristic described in connection with the embodiment is included in at least one embodiment of the present disclosure. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly, it should be appreciated that in the description of exemplary embodiments of the disclosure, various features of the disclosure are sometimes grouped in a single embodiment, figure, or description thereof for the purpose of streamlining the disclosure and aiding in the understanding of one or more of the various disclosed aspects. This method of disclosure, however, is not to be interpreted as reflecting an intention that the claimed disclosure requires more features than are expressly recited in each claim. Rather, as the following claims reflect, disclosed aspects lie in less than all features of a single foregoing disclosed embodiment. Thus, the claims following the detailed description are hereby expressly incorporated into this detailed description, with each claim standing on its own as a separate embodiment of this disclosure.

Furthermore, while some embodiments described herein include some but not other features included in other embodiments, combinations of features of different embodiments are meant to be within the scope of the disclosure, and form different embodiments, as would be understood by those in the art. For example, in the following claims, any of the claimed embodiments can be used in any combination.

Furthermore, some of the embodiments are described herein as a method or combination of elements of a method that can be implemented by a processor of a computer system or by other means of carrying out the function. Thus, a processor with the necessary instructions for carrying out such a method or element of a method forms a means for carrying out the method or element of a method. Furthermore, an element described herein of an apparatus embodiment is an example of a means for carrying out the function performed by the element for the purpose of carrying out the disclosure.

In the description provided herein, numerous specific details are set forth. However, it is understood that embodiments of the disclosure may be practiced without these specific details. In other instances, well-known methods, structures and techniques have not been shown in detail in order not to obscure an understanding of this description.

The following terms are provided solely to aid in the understanding of the disclosure.

As used herein, and unless provided otherwise, a nanosheet typically relates to a structure having a first dimension (typically its height in the case of a horizontal nanosheet or its width in the case of a vertical nanosheet) measuring 100 nm or less, having a ratio between its two other dimensions (typically its width and its length in the case of a horizontal nanosheet or its length and its height in the case of a vertical nanosheet) ranging from 0.2 to 5.0, and having a ratio between its first dimension and each of the two other dimensions amounting to less than 0.5, usually less than 0.1. It is typically separated from an underlying structure by a gap. A nanosheet channel is a field effect transistor channel comprised in a nanosheet.

As used herein, and unless provided otherwise, a nanowire typically relates to a structure having two dimensions (typically its width and its height) measuring 100 nm or less, having a ratio between these two dimensions ranging from 0.7 to 1.3, from 0.8 to 1.2, from 0.9 to 1.1, usually 1, and having a ratio between each of these two dimensions and its third dimension (typically its length) amounting to less than 0.5, usually less than 0.1. It is typically separated from an underlying structure by a gap. A nanowire channel is a field effect transistor channel comprised in a nanowire.

As used herein, and unless provided otherwise, a fin typically relates to a vertical structure having a first dimension (typically its height) measuring 100 nm or less, a second dimension (typically its width) measuring 20 nm or less, a ratio of its first dimension (e.g. height) to its second dimension (e.g. width) of at least 2, and a ratio between its third dimension (typically its length) and its second dimension (e.g. width) of at least two. It typically extends perpendicularly (directly, without a gap) from a substrate. A fin channel is a field-effect transistor channel comprised in a fin.

As used herein, and unless provided otherwise, two superimposed structures are a bottom and a top structure wherein the projection of a bottom surface of the top structure on a top surface of the bottom structure overlaps.

The disclosure will now be described by a detailed description of several embodiments of the disclosure. It is clear that other embodiments of the disclosure can be configured according to the knowledge of persons skilled in the art without departing from the true spirit or technical teaching of the disclosure, the disclosure being limited only by the terms of the appended claims.

Reference will be made to transistors. These are devices having a first main electrode such as a drain, a second main electrode such as a source and a control electrode such as a gate for controlling the flow of electrical charges between the first and second main electrodes.

The present disclosure results from the realization that partially filling a gap between two superimposed elements in a semiconductor device under construction simply by first entirely filling that gap with a hard mask material, followed by an etch back of the hard mask material until only part of the gap is filled, is not satisfactory.

As a comparative example, in the case of the fabrication of a CFET similar to the one described in Ryckaert J. et al, the formation of a different gate stack for the p-type channel and the n-type channel could encompass the following steps for performing the replacement metal gate at the end of the device fabrication. First, the dummy gate (2) can be removed (see FIGS. 1 and 2). Then, the SiGe sacrificial layer separating both channels (1) can be removed as well. Next, a dielectric layer (12), e.g. composed first of a silicon oxide sublayer and second of a high-k dielectric sublayer, can be formed conformally around the exposed surfaces of both channels (1). Next, a first work function metal layer (13) such as TiN (13) can be formed conformally around exposed surfaces of both gate dielectric layers (12) (see FIG. 3). The remaining steps are not depicted. At this stage, in order to enable the removal of the work function metal formed around the top structure without removing the work function metal formed around the bottom structure, a material can be deposited so as to protect the bottom structure without covering the top structure. In the present comparative example, SoC is chosen as that material. So, SoC is formed so as to protect the bottom structure and so as to fill the entire gap present between the bottom and the top structures. Next, SoC is etched back until both superimposed structures are no longer bridged by SoC. However, since part of the SoC is hardly accessible from above because of a shadow effect due to the top feature, an SoC spike projecting from the SoC toward the bottom surface of the top structure is created. Removing this spike or limiting its height can be achieved by continuing the etch back process until the height of this spike has been sufficiently reduced. This, however, has the disadvantage of imposing a lower limit to the space (15) height that can be partially filled between two given superimposed structures (16, 17). The remaining steps of the formation of the two gate stacks could be as follow. First, the work function metal formed around the top structure can be removed. In the case of the work function metal being TiN, this can, for instance, be done by a wet etching with a hydrogen peroxide and hydrochloric acid solution (HPM) or an ammonia and hydrogen peroxide solution (APM), thereby exposing the underlying high-K dielectric material. Now that the SoC performed its protective duty, it can be removed. This can, for instance, be done by exposure to forming gas, thereby revealing the work function metal present underneath. Now, further metal layers can be formed around the bottom and the top structure as desired.

The problem of how to avoid the lower limit imposed by the removal of the spike or the reduction of the spike height led to the first aspect of the present disclosure.

In a first aspect, the present disclosure refers to a method for partially filling a space between two superimposed structures in a semiconductor device under construction.

The method of the first aspect applies to any pair of superimposed structures in a semiconductor device under construction separated by a space which must be partially filled.

In step a, two superimposed structures having said space therebetween are provided.

The present method is particularly suitable for superimposed structures separated by a space measuring at most 100 nm, at most 50 nm, and usually at most 30 nm.

The present method is particularly suitable for superimposed structures separated by a space measuring (i.e. which vertical extent measures) at least 10 nm, at least 15 nm, usually at least 25 nm. Each of these lower limits can be combined with any higher limit described in the paragraph just above.

For instance, said space may be from 10 to 100 nm or from 25 to 30 nm.

Figure 3:
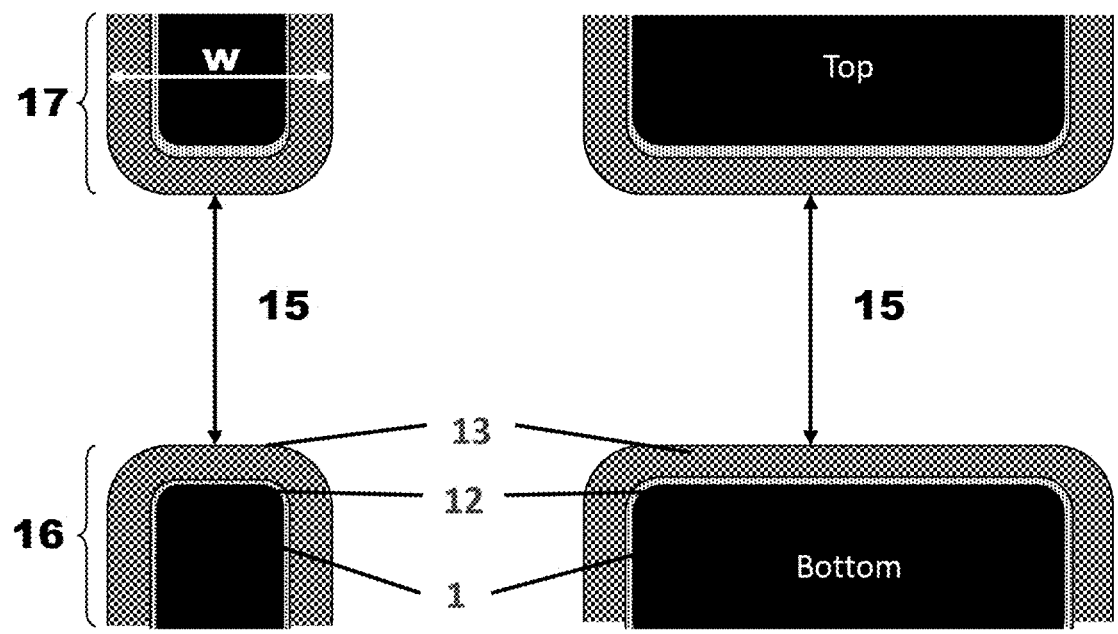
FIGS. 3 to 7 are schematic illustrations of successive steps of an embodiment of the present disclosure; the left side of these figures schematically represents vertical cross-sections taken perpendicularly to the longitudinal direction of a vertical nanosheet atop a fin while the right side of these figures schematically represents vertical cross-sections taken along the longitudinal direction of a vertical nanosheet atop a vertical nanosheet.
Figure 4:
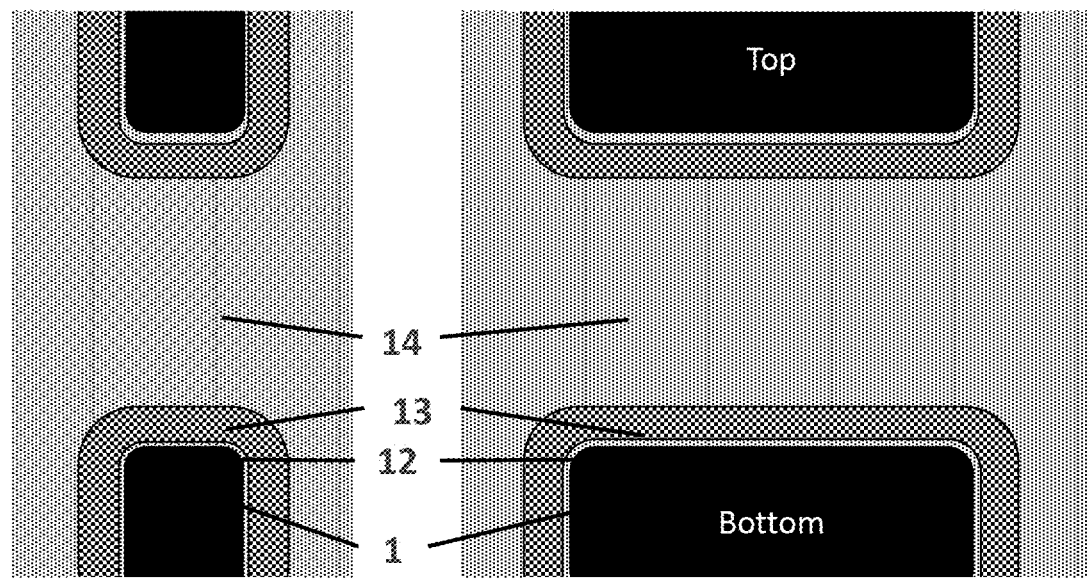

The method is for partially filling the space. This means that the aim of the method is to fill part of that space and not all of that space. Referring now to FIG. 3 where a space (15) between two superimposed structures (16, 17) (a fin (1) and a vertical nanosheet (1) are depicted on the left side and a vertical nanosheet (1) on a vertical nanosheet (1) are depicted on the right side) is visible, partially filling this space (15) (see FIG. 7) corresponds to providing thermoplastic material (14) on the top surface of the bottom structure (16) but not providing enough material (14) to reach the bottom surface of the top structure (17). A bottom part of the space (15), in contact with the bottom structure (16), is thereby filled. It is the vertical extent of the space (15) which is partially filled. Typically, the lateral extent of the space (15) defined by the overlap of the projection of the bottom surface of the top structure (17) on the top surface of the bottom structure (16) is entirely filled up to at least a certain height of the filling, up to at least 50% of the height (h) of the filling, usually until at least 90% of the height (h) of the filling, and generally for the entire height (h) of the filling (which would correspond to the filling having a flat top surface). It is an advantage of embodiments of the present disclosure that a flat top surface can be obtained for the filling. When the top surface of the filling isn't flat, it is anyway typically flatter directly below the top structure than it would have been if a combination hard mask material/plasma etching had been used instead of the thermoplastic material/removal/heating approach of the present disclosure.

Most typically, partially filling said space comprises covering the entirety of the bottom structure. Typically, regions of a substrate over which (e.g. on which) the bottom structure is present and surrounding the bottom structure are also covered by the partial filling.

Partially filling the space provided in step a is achieved by performing steps b to d.

In embodiments, each of the superimposed structures (16, 17) may comprise a transistor channel (1).

In embodiments, each of the superimposed structures (16, 17) may comprise a transistor channel (1) having a dielectric layer (12) thereon.

In embodiments, each of the superimposed structures (16, 17) may comprise a transistor channel (1) having a dielectric layer (12) thereon, and a first conductive layer (13) on the dielectric layer (12).

In embodiments, each of the transistor channels may be a silicon transistor channel.

In embodiments, the dielectric layer may comprise a high-k layer.

In embodiments, the dielectric layer may comprise a silicon oxide layer on the channel and a high-k layer on the silicon oxide layer.

In embodiments, the high-k layer may be a $HfO_2$ layer.

In embodiments, the first conductive layer may be a p-work function metal layer such as TiN.

Figure 8:
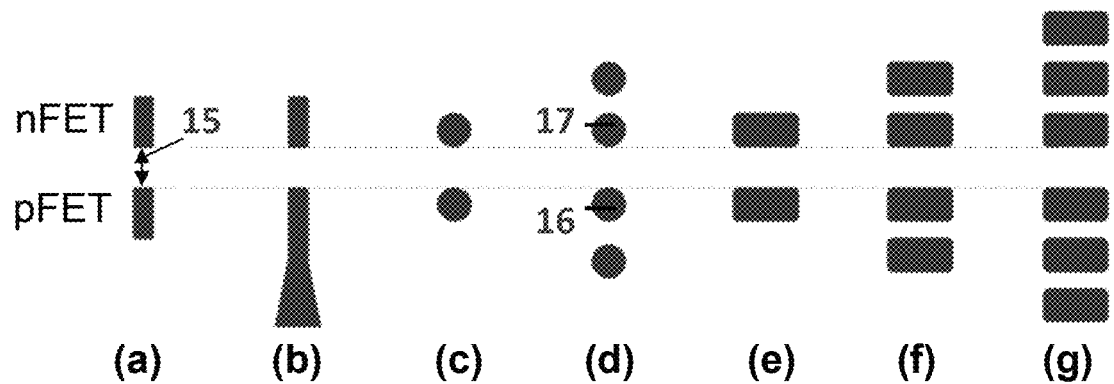
FIG. 8, parts (a) to (g), show schematic illustrations of vertical cross-sections through superimposed structures that can be used in a method according to embodiments of the present disclosure.

In embodiments, any of the transistor channels may independently be a nanosheet channel, a nanowire channel (typically a horizontal nanowire channel), or a fin channel. Some examples of superimposed transistor channels to which the present disclosure is applicable are shown in FIG. 8, parts (a) to (g). In the examples of FIG. 8, parts (a) to (g), the bottom structure is a pFET channel and the top structure is an nFET channel but the present disclosure is also applicable when it is the other way around. In FIG. 8, part (a), the top structure (17) is a vertical nanosheet and the bottom structure (16) is a vertical nanosheet. In FIG. 8, part (b), the top structure (17) is a vertical nanosheet and the bottom structure (16) is a fin. In FIG. 8, part (c), the top structure (17) is a nanowire and the bottom structure (16) is a nanowire. In FIG. 8, part (d), the top structure (17) is a nanowire belonging to a set of two nFET nanowire channels and the bottom structure (16) is a nanowire belonging to a set of two pFET nanowire channels. In FIG. 8, part (e), the top structure (17) is a horizontal nanosheet and the bottom structure (16) is a horizontal nanosheet. In FIG. 8, part (f), the top structure (17) is a horizontal nanosheet belonging to a set of two nFET horizontal nanosheet channels and the bottom structure (16) is a nanosheet belonging to a set of two pFET horizontal nanosheet channels. In FIG. 8, part (g), the top structure (17) is a horizontal nanosheet belonging to a set of three nFET horizontal nanosheet channels and the bottom structure (16) is a nanosheet belonging to a set of three pFET horizontal nanosheet channels. When a fin is present, it is usually the bottom structure (16).

In embodiments, the two superimposed structures (16, 17) may comprise a top structure (17) and a bottom structure (16), wherein the top structure (17) comprises a nanosheet channel (1) and wherein the bottom structure (16) comprises either a fin channel (1) (see FIG. 3 left, FIG. 8, part (b)) or another nanosheet channel (1) (see FIG. 3 right, FIG. 8 (parts a, e, f, or g)). In particular embodiments, the top structure (17) may comprise a vertical nanosheet channel (1) and the bottom structure (16) may comprise a fin channel (1) (see FIG. 3 left, FIG. 8, part (b)) or another vertical nanosheet channel (1) (see FIG. 3 right, FIG. 8, part (a)). In some embodiments, the top structure may comprise a vertical nanosheet channel and the bottom structure may comprise a fin channel. In embodiments, the top structure may be one of a plurality of nanosheet channels and the bottom structure may be one of a plurality of fin channels or one of a plurality of vertical nanosheet channels, usually one of a plurality of fin channels.

In embodiments, each of the two superimposed structures may have their smallest lateral dimension measuring from 10 to 100 nm, usually from 25 to 50 nm.

In embodiments, the two superimposed structures may comprise a top structure and a bottom structure, wherein the top structure comprises an NMOS transistor channel and wherein the bottom structure comprises a PMOS transistor channel. In other embodiments, the top structure may comprise a PMOS transistor channel and the bottom structure may comprise an NMOS transistor channel.

In embodiments, the semiconductor device under construction may be a CFET (under construction).

In step b, said space is entirely filled with a thermoplastic material. Any type of thermoplastic material can be used, provided it can be removed selectively with respect to the two superimposed structures. Generally, the thermoplastic material may be a photosensitive thermoplastic material which becomes selectively removable after exposure to an electromagnetic radiation with respect to the same photosensitive thermoplastic material not having been exposed to the electromagnetic radiation.

By "entirely filled" it is meant that the entire vertical extent of the space (and usually also the entire lateral extent of the space) is filled. The lateral extent being the overlap of the vertical projection of a bottom surface of the top structure on a top surface of the bottom structure.

In embodiments, the material used in step b is said to be photosensitive because it reacts with an electromagnetic radiation to become selectively removable with respect to the same material not having been exposed to the electromagnetic radiation.

Typically, the thermoplastic material (e.g. the photosensitive thermoplastic material) can flow at a temperature inferior to a decomposition temperature for that material.

In embodiments, the photosensitive thermoplastic material may be a developable bottom anti-reflective coating material.

In embodiments, the photosensitive thermoplastic material may comprise the reaction product of a dienophile and a diene. In embodiments, dienes and dienophile both have unsaturated groups and generally can combine to form a cyclic adduct in which there is a net reduction of the bond multiplicity. In embodiments, dienes are electron-rich and include carbocyclic or heteroaromatic groups, including multiple ring carbocyclic or heteroaromatic groups, particularly fused ring groups such as anthracene or pentacene groups. In embodiments, dienophiles include groups that comprise olefin moieties that have proximate (e.g. within 1, 2, or 3 atoms) electron-withdrawing substituent(s) e.g. dienophiles include groups that comprise one or more α,β-unsaturated groups. In one embodiment, dienophiles include imide-containing groups, particularly maleimides, anhydrides such as maleic anhydride, and other groups such as dimethylacetylene dicarboxylate.

Generally, the photosensitive thermoplastic material may comprise a reaction product component that is a Diels Alder reaction product of a diene and a dienophile as discussed above. The term "Diels Alder reaction" is used herein in accordance with its well-recognized meaning, i.e. a (4+2) cycloaddition, e.g. as referred to under the definition of "cycloaddition" in Compendium of Chemical Technology, IUPAC Recommendations, $2^{nd}$ edition (1997 Blackwell Science). In embodiments, Diels Alder reaction products include a reaction product of (i) an imide-containing compound e.g. maleimide or other dienophiles e.g. anhydrides such as maleic anhydride, and other groups such as dimethylacetylene dicarboxylate and (ii) a polycyclic aromatic group. In one embodiment, Diels Alder reaction products include a reaction product of (1) an imide-containing compound e.g. maleimide or other dienophiles e.g. anhydrides such as maleic anhydride, and other groups such as dimethylacetylene dicarboxylate and (2) an anthracene or pentacene group.

In embodiments, the dienophile is an imide-containing dienophile and the diene is a polycyclic aromatic group, or (ii) the diene is an anthracene or pentacene group.

In embodiments, the photosensitive thermoplastic material is a resin selected from homopolymers and mixed polymers such as copolymers (two distinct repeat units), terpolymers (three distinct repeat units), tetrapolymers (four distinct repeat units), pentapolymers (five distinct repeat units) and other higher order polymers.

Typically, the photosensitive thermoplastic material is a resin comprising a photoacid generator and at least one functional group reacting with the acid generated by the photoacid generator to make the photosensitive thermoplastic material selectively removable with respect to the photosensitive thermoplastic material not having been exposed to the electromagnetic radiation and hence to the acid.

In one embodiment, photosensitive thermoplastic materials are resins that comprise a photoacid generator and at least three or four other distinct functional groups that can impart the following properties (1) dissolution rate inhibition; (2) strip resistance; (3) desired aqueous alkaline developer solubility (e.g. a photoacid-labile group such as a photoacid-labile ester (e.g. $-C(=O)OC(CH_3)_3$) or an acetal moiety); and (4) a chromophore group to absorb undesired reflections of photoresist exposure radiation (e.g. a carbocyclic aryl group such as optionally substituted phenyl, naphthyl or anthracenyl). Generally, chromophores for inclusion in the photosensitive thermoplastic material include both single ring and multiple ring aromatic groups such as optionally substituted phenyl, optionally substituted naphthyl, optionally substituted anthracenyl, optionally substituted phenanthracenyl, optionally substituted quinolinyl, and the like.

A photoacid generator compound is a compound that can generate acid upon exposure to activating radiation. For instance, upon exposure to an electromagnetic radiation at 193 nm. Photoacid generator compound(s) included in the photosensitive thermoplastic material can generate acid upon treatment with electromagnetic radiation. By such use of photoacid generator compound(s), acid is not liberated from the photoacid generator compound(s) before irradiation. Exposure of the photosensitive material to the activating radiation liberates acid from the photoacid generator compound(s) which facilitate desired selective development of the photosensitive thermoplastic material during step c (e.g. a treatment with an aqueous alkaline developer).

In embodiments, the photosensitive thermoplastic material used in the present disclosure may be a coating composition as described in US20170108776A1, the content of which being incorporated herein in its entirety.

In embodiments, the electromagnetic radiation, after which exposure the photosensitive thermoplastic material becomes selectively removable with respect to the same photosensitive thermoplastic material not having been exposed to the electromagnetic radiation, may be ultraviolet radiation, UV-C radiation, usually ArF excimer radiation (193 nm).

Step c can be performed by a dry etching technique, such as a plasma etch, selective toward the thermoplastic material with respect to the two superimposed structures.

Figure 5:
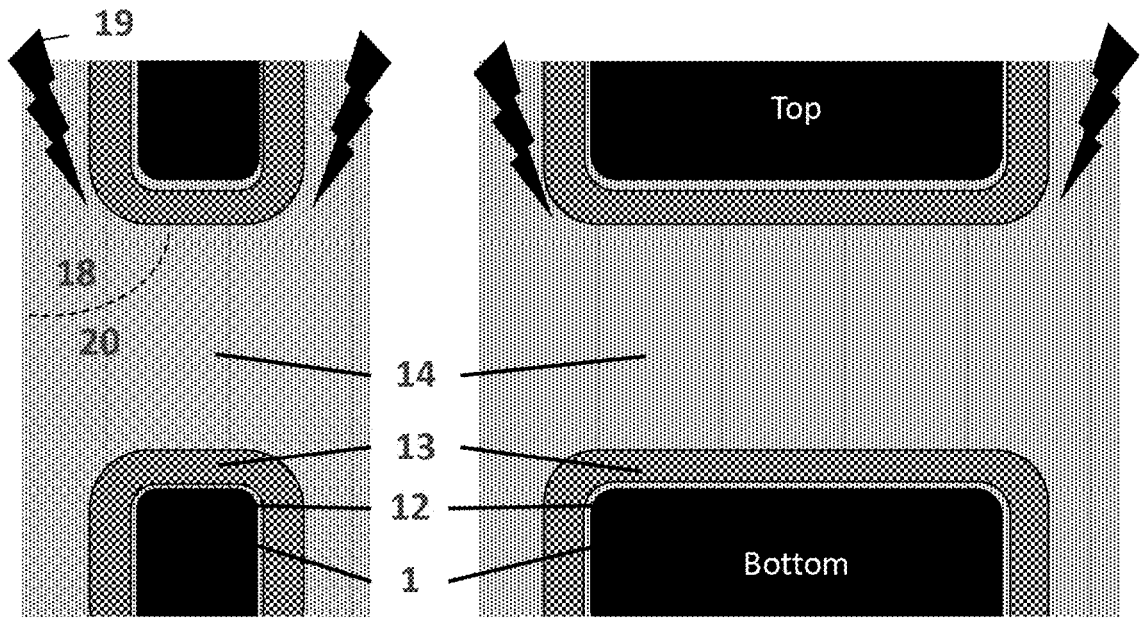

In embodiments, illustrated in FIGS. 4 to 7, wherein the thermoplastic material (14) is a photosensitive thermoplastic material (14), step c may comprise sufficiently exposing a first portion (18) of the photosensitive thermoplastic material (14) present in said space (15) to the electromagnetic radiation (19) for making this first portion (18) removable. This is illustrated in FIG. 5. This way, a second portion (20) of the photosensitive thermoplastic material (14) remains unexposed (or not sufficiently exposed to be removable in step c2) and will, therefore, remain after step c2. The duration of the exposure can be adapted so that only a portion of the photosensitive thermoplastic material (14) present in said space (15) is sufficiently exposed to the electromagnetic radiation (19) to be removable is step c2.

Figure 6:
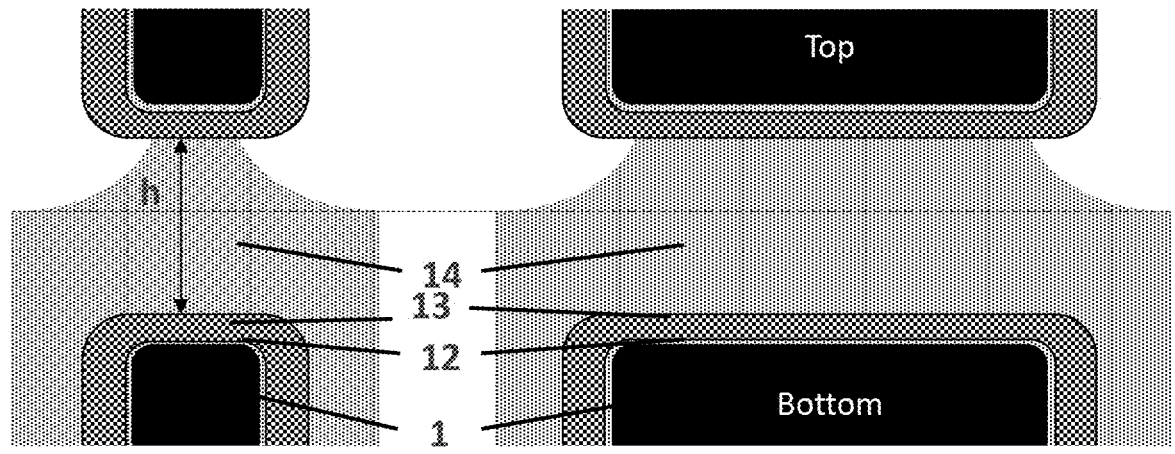
Figure 7:
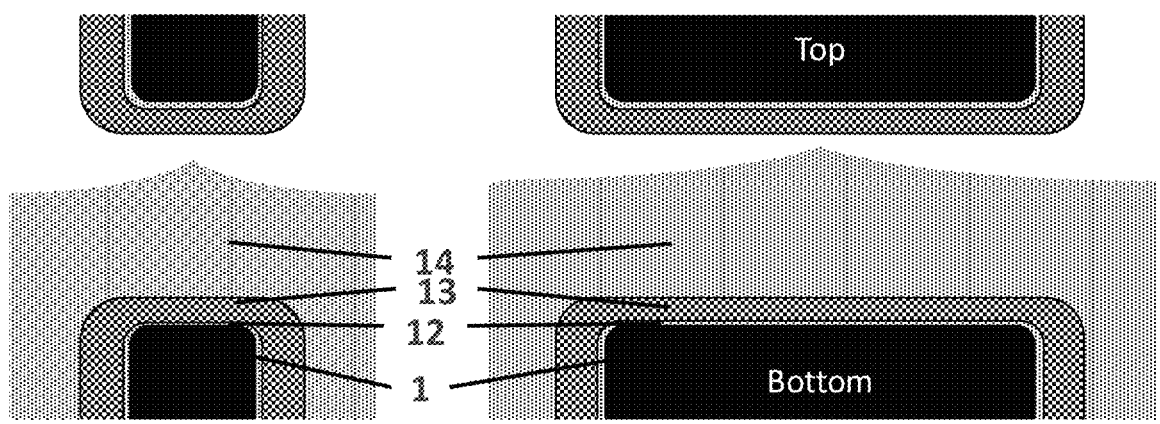

In other words, in embodiments, step b may comprise entirely filling said space (15) with a photosensitive thermoplastic material (14) which becomes selectively removable after exposure to an electromagnetic radiation (19) with respect to the same photosensitive thermoplastic material (14) not having been exposed to the electromagnetic radiation (19) (see FIG. 4), and step c may then comprise:

c1. exposing the first portion (18) of the photosensitive thermoplastic material (14) present in said space (15) to the electromagnetic radiation (19), thereby making this first portion (18) selectively removable with respect to a second portion (20) of the photosensitive thermoplastic material (14) not having been exposed to the electromagnetic radiation (19) (see FIG. 5), and c2. selectively removing the exposed first portion (18) with respect to the second portion (20), thereby leaving in said space (15) the second portion (20) having a height (h) (see FIG. 6). The result of step d is shown in FIG. 7.

The first portion (18) comprises at least part of a top surface of the photosensitive thermoplastic material (14) present in the space (15). According to the first aspect of the present disclosure, in order to obtain a thermoplastic material measuring a particular height in the space, it is not necessary to remove the thermoplastic material (e.g. via etching or a combination of irradiation and developing) until that height of the thermoplastic material remains. Instead, the removal can be performed for a shorter duration, thereby initially obtaining a remaining part of the thermoplastic material measuring a larger height in the space. Indeed, a heating step d after the exposure step and the selective removal step will further reduce the height of the thermoplastic material, i.e. it will make it more planar.

According to the first aspect of the present disclosure, in order to obtain a photosensitive thermoplastic material measuring a particular height in the space, it is not necessary to prolong the exposure to the electromagnetic radiation until that height of the photosensitive thermoplastic material remains. Instead, the exposure to the electromagnetic radiation can be performed for a shorter duration, thereby initially obtaining an unexposed part of the photosensitive thermoplastic material measuring a larger height in the space. Indeed, an annealing step d after the exposure step and the selective removal step will further reduce the height of the photosensitive thermoplastic material, i.e. it will make it more planar.

In embodiments, step c of removing the first portion results in leaving in said space a remaining thermoplastic material (a second portion) having a height (measured from the top surface of the bottom structure). In some embodiments, the profile of the remaining thermoplastic material may comprise a spike and the height may be measured at the position of the spike. In other embodiments, the profile of the remaining thermoplastic material (14) may comprise a narrower section at a top portion of the space (15) and a broader section at a bottom portion of the space (15) with the height (h) of the photosensitive thermoplastic material (14) corresponding to the vertical extent of the space (15). This is the situation is illustrated in FIG. 6.

In embodiments where the thermoplastic material is a photosensitive thermoplastic material, step c of selectively removing the exposed first portion can be achieved by contacting a top surface of the photosensitive thermoplastic material with an aqueous alkaline solution. Examples of suitable aqueous alkaline solutions are a tetramethyl ammonium hydroxide aqueous solution, a sodium hydroxide aqueous solution, a potassium hydroxide aqueous solution, a sodium carbonate aqueous solution, a sodium bicarbonate aqueous solution, a sodium silicate aqueous solution, a sodium metasilicate aqueous solution, aqueous ammonia or the like. A particular example thereof is a 0.26N tetramethyl ammonium hydroxide aqueous solution.

In step d, the remaining thermoplastic material is heated up so as to reduce its height to a final height. Typically, the remaining thermoplastic material is heated up so that it flows. For this purpose, it can be heated up above its Tg or its melting point. In embodiments, the final height may be from 30 to 70%, usually 40 to 60% of the vertical extent of the space. Usually, after step d, the remaining thermoplastic material has a top surface which highest point equals its final height and which lowest point is separated from the top of the bottom structure by a distance equal to from 80 to 100% of the final height, from 90 to 100% of the final height, and usually from 95 to 100% of the final height. In one embodiment, the top surface of the thermoplastic material after step d is a flat surface.

In embodiments, the method of the first aspect may be part of a replacement metal gate process. In one such embodiments, the present disclosure may relate to a replacement metal gate process for forming a different gate stack on two superimposed transistor channels in a semiconductor device under construction, the process comprising:

(i) Performing the method according to the first aspect, as for instance illustrated in FIGS. 3-7, wherein each of the two superimposed structures comprises:
  a. a transistor channel having a dielectric layer thereon, and
  b. a first conductive layer on the dielectric layer, thereby protecting the first conductive layer of the lowest of both superimposed structures;

(ii) removing the first conductive layer from the highest of both superimposed structures, thereby exposing the dielectric layer of the highest of both superimposed structures;

(iii) removing the heated remaining thermoplastic material, thereby exposing the first conductive layer of the lowest of both superimposed structures; and (iv) coating with a second conductive layer:
  a. the dielectric layer of the highest of both superimposed structures, and
  b. the first conductive layer of the lowest of both superimposed structures,
  thereby forming a different gate stack on the two superimposed transistor channels.

Figure 2:
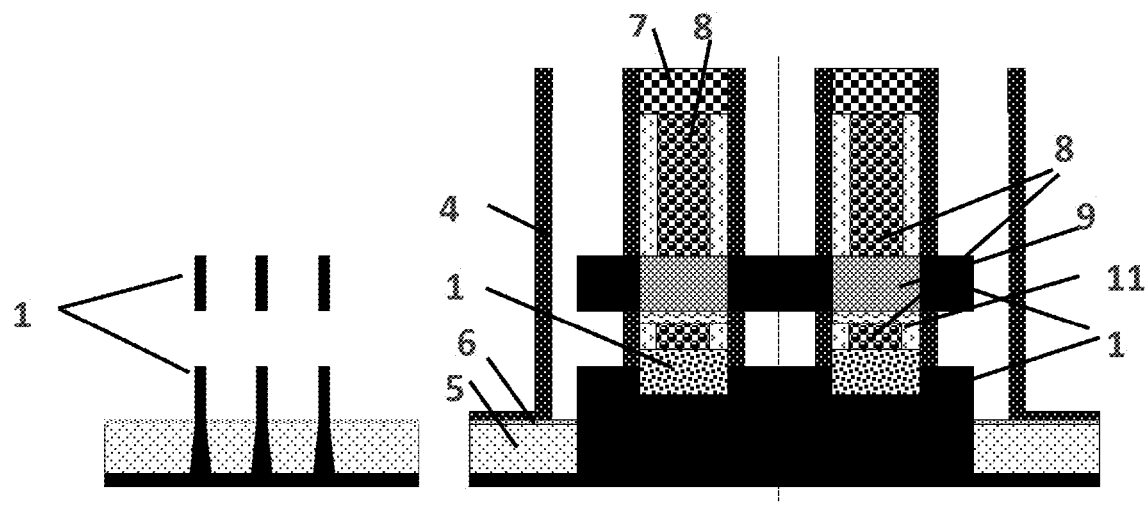
FIG. 2 corresponds to FIG. 1 wherein the dummy gate has been removed.

In embodiments where the method of the first aspect is part of a replacement metal gate process, a preliminary step (0) to step (i) (as exemplified in FIGS. 1 and 2) may be first to provide a semiconductor structure comprising:
  a semiconductor substrate (s);
  two superimposed structures (16, 17) (e.g. a fin (16) protruding from the substrate (s) and a vertical nanowire (17) above the fin (16) in the case of FIG. 1), each structure (16, 17) comprising a transistor channel (1); and a dummy gate (2) embedding both superimposed structures (16, 17).

In the example of FIG. 1, the substrate (s) is a silicon substrate (s) from which a plurality of fins (1) protrudes. Suspended above the fins (1) are a corresponding plurality of vertical nanowires (1), each nanowire (1) being aligned vertically with a fin (1). The bases of the fins (1) are buried in an oxide (5, 6) which can be a combination of a shallow trench isolation (5) and a pad oxide (6). Electrodes (a source electrode and a drain electrode) are depicted. A bottom electrode (10), comprising SiGe:B, in contact with the fins (1), is grown by epitaxy on a portion of the fin (1). A metal contact (8) is contacting the bottom electrode (10). A barrier layer (21) (e.g. TiN) is lining the sides of the metal contact (8) (e.g. W, Ru, Co, or Al) and a dielectric contact isolation (11) (e.g. $Si_3N_4$ or SiCO) is present on top of the metal contact (8) so as to isolate it from the upper structure (17) (the vertical nanowire). A top electrode (9) comprising Si:P is epitaxially grown on a portion of the vertical nanowire (1). A metal contact (8) is contacting the top electrode (9). A barrier layer (21) (e.g. TiN) is lining the sides of the metal contact (8) and a dielectric cap (7) (e.g. $SiO_2$) is present on top of the metal contact. Between the source and the drain, a dummy gate structure is present and comprises gate spacers (4) (e.g. $Si_3N_4$ or low-k SiCO), a dummy gate (2) in between the spacers (4) (e.g. poly-Si or amorphous Si), and a gate hardmask (3) on top thereof (e.g. $Si_3N_4$).

Second, after the semiconductor structure of FIG. 1 has been provided, the dummy gate (2) can be removed, thereby providing the two superimposed structures (16, 17) having said space (15) therebetween. At that stage, steps b to d can be performed.

In a second aspect, the present disclosure relates to a semiconductor device under construction comprising
 a. two superimposed structures having a space therebetween; and
 b. a photosensitive thermoplastic material partially filling said space, said material being such as to become selectively removable after exposure to an electromagnetic radiation with respect to the same photosensitive thermoplastic material not having been exposed to the electromagnetic radiation.

Any feature of the second aspect may be as correspondingly described in the first aspect.

Other arrangements for accomplishing the objectives of the methods and devices embodying the disclosure will be obvious for those skilled in the art.

It is to be understood that although disclosed embodiments, specific constructions and configurations, as well as materials, have been discussed herein for devices according to the present disclosure, various changes or modifications in form and detail may be made without departing from the scope and spirit of this disclosure. For example, any formulas given above are merely representative of procedures that may be used. Functionality may be added or deleted from the block diagrams and operations may be interchanged among functional blocks. Steps may be added or deleted to methods described within the scope of the present disclosure.

The invention claimed is:

1. A method for partially filling a space between two superimposed structures in a semiconductor device under construction, comprising the steps of:
 (a) providing the two superimposed structures having said space therebetween;
 (b) entirely filling the space with a thermoplastic material;
 (c) removing a first portion of the thermoplastic material present in the space, the first portion comprising at least part of a top surface of the thermoplastic material present in the space, thereby leaving in the space a remaining thermoplastic material having a height (h); and
 (d) heating up the remaining thermoplastic material so as to reduce its height (h).

2. The method according to claim 1, wherein step (b) comprises entirely filling said space with a photosensitive thermoplastic material which becomes selectively removable after exposure to an electromagnetic radiation with respect to the same photosensitive thermoplastic material not having been exposed to the electromagnetic radiation, wherein step (c) comprises:
 (c1) exposing the first portion of the photosensitive thermoplastic material present in said space to the electromagnetic radiation, thereby making the exposed first portion selectively removable with respect to a second portion of the photosensitive thermoplastic material not having been exposed to the electromagnetic radiation; and
 (c2) selectively removing the exposed first portion with respect to the second portion, thereby leaving in said space the second portion having a height (h).

3. The method according to claim 1, wherein each of the two superimposed structures comprises a transistor channel.

4. The method according to claim 2, wherein each of the two superimposed structures comprises a transistor channel.

5. The method according to claim 1, wherein the semiconductor device under construction is a complementary field-effect transistor.

6. The method according to claim 1, wherein the two superimposed structures comprise a top structure and a bottom structure, wherein the top structure comprises a nanosheet channel and wherein the bottom structure comprises either a fin channel or another nanosheet channel.

7. The method according to claim 6, wherein the top structure comprises a vertical nanosheet channel and wherein the bottom structure comprises a fin channel.

8. The method according to claim 1, wherein said space ranges from 10 to 100 nm.

9. The method according to claim 8, wherein said space ranges from 25 to 30 nm.

10. The method according to claim 1, wherein each of the two superimposed structures has its smallest lateral dimension (w) measuring from 10 to 100 nm.

11. The method according to claim 10, wherein said smallest lateral dimension (w) measures from 25 to 50 nm.

12. The method according to claim 2, wherein the photosensitive thermoplastic material is a developable bottom anti-reflective coating material.

13. The method according to claim 2, wherein the photosensitive thermoplastic material comprises the reaction product of a dienophile and a diene.

14. The method according to claim 13, wherein (i) the dienophile is an imide-containing dienophile and the diene is a polycyclic aromatic group, or (ii) the diene is an anthracene or pentacene group.

15. A replacement metal gate process for forming a different gate stack on two superimposed transistor channels in a semiconductor device under construction, the process comprising:
 (i) performing the method according to claim 1, wherein each of the two superimposed structures comprises:
  (a) a transistor channel having a dielectric layer thereon, and (b) a first conductive layer on the dielectric layer, thereby protecting the first conductive layer of the lowest of both superimposed structures;
(ii) removing the first conductive layer from the highest of both superimposed structures, thereby exposing the dielectric layer of the highest of both superimposed structures;
(iii) removing the heated remaining thermoplastic material, thereby exposing the first conductive layer of the lowest of both superimposed structures; and
(iv) coating with a second conductive layer:
   (a) the dielectric layer of the highest of both superimposed structures, and
   (b) the first conductive layer of the lowest of both superimposed structures, thereby forming a different gate stack on the two superimposed transistor channels.

* * * * *